United States Patent
Ishishita et al.

(10) Patent No.: US 7,268,532 B2
(45) Date of Patent: Sep. 11, 2007

(54) APPARATUS AND METHOD FOR CALCULATING OFFSET VALUE FOR AN ELECTRIC SENSOR

(75) Inventors: Teruo Ishishita, Nishikamo-gun (JP); Yoshiaki Kikuchi, Toyota (JP)

(73) Assignee: Toyota Jidosha Kabushiki Kaisha, Toyota (JP)

(*) Notice: Subject to any disclaimer, the term of this patent is extended or adjusted under 35 U.S.C. 154(b) by 0 days.

(21) Appl. No.: 10/727,588

(22) Filed: Dec. 5, 2003

(65) Prior Publication Data

US 2004/0138836 A1 Jul. 15, 2004

(30) Foreign Application Priority Data

Dec. 13, 2002 (JP) .............................. 2002-362226

(51) Int. Cl.
*G01R 15/18* (2006.01)
(52) U.S. Cl. .................................. 324/117 R
(58) Field of Classification Search ............ 324/117 R, 324/117 H, 765, 158.1, 426; 320/136, 134, 320/132, 149
See application file for complete search history.

(56) References Cited

U.S. PATENT DOCUMENTS 6,331,762 B1 * 12/2001 Bertness ..................... 320/134
6,621,250 B1 * 9/2003 Ohkubo et al. ............. 320/136

FOREIGN PATENT DOCUMENTS

| JP | 04-134270 | 5/1992 |
| JP | A 6-38386 | 2/1994 |
| JP | 07-077541 A | 3/1995 |
| JP | A 11-150873 | 6/1999 |
| JP | A 2001-78365 | 3/2001 |
| JP | A 2001-264362 | 9/2001 |
| JP | A 2001-327002 | 11/2001 |

* cited by examiner

*Primary Examiner*—Ha Tran Nguyen
*Assistant Examiner*—Tung X. Nguyen
(74) *Attorney, Agent, or Firm*—Kenyon & Kenyon LLP

(57) ABSTRACT

Calculation of an offset value is permitted when a current value detected by an ammeter of a magnetic flux detection type is switched from a negative value to a positive value, or from a positive value to a negative value, and also a state where an absolute value of the current value is with in a predetermined range is continued for a predetermined time. When calculation of the offset value is permitted, the fact that an ignition switch is turned OFF is detected, and the current value detected by the ammeter is calculated as the offset value.

10 Claims, 7 Drawing Sheets

| TEMPERATURE (°C) | −30 | −20 | −10 | 0 | 20 | 40 | 60 |
|---|---|---|---|---|---|---|---|
| T_DIS(sec) | | | | | | | |

| TEMPERATURE (°C) | −30 | −20 | −10 | 0 | 20 | 40 | 60 |
|---|---|---|---|---|---|---|---|
| T_CHG(sec) | | | | | | | |

| TEMPERATURE (°C) | −30 | −20 | −10 | 0 | 20 | 40 | 60 |
|---|---|---|---|---|---|---|---|
| I_HYS_DIS_(A) | | | | | | | |

| TEMPERATURE (°C) | −30 | −20 | −10 | 0 | 20 | 40 | 60 |
|---|---|---|---|---|---|---|---|
| I_HYS_CHG(A) | | | | | | | |

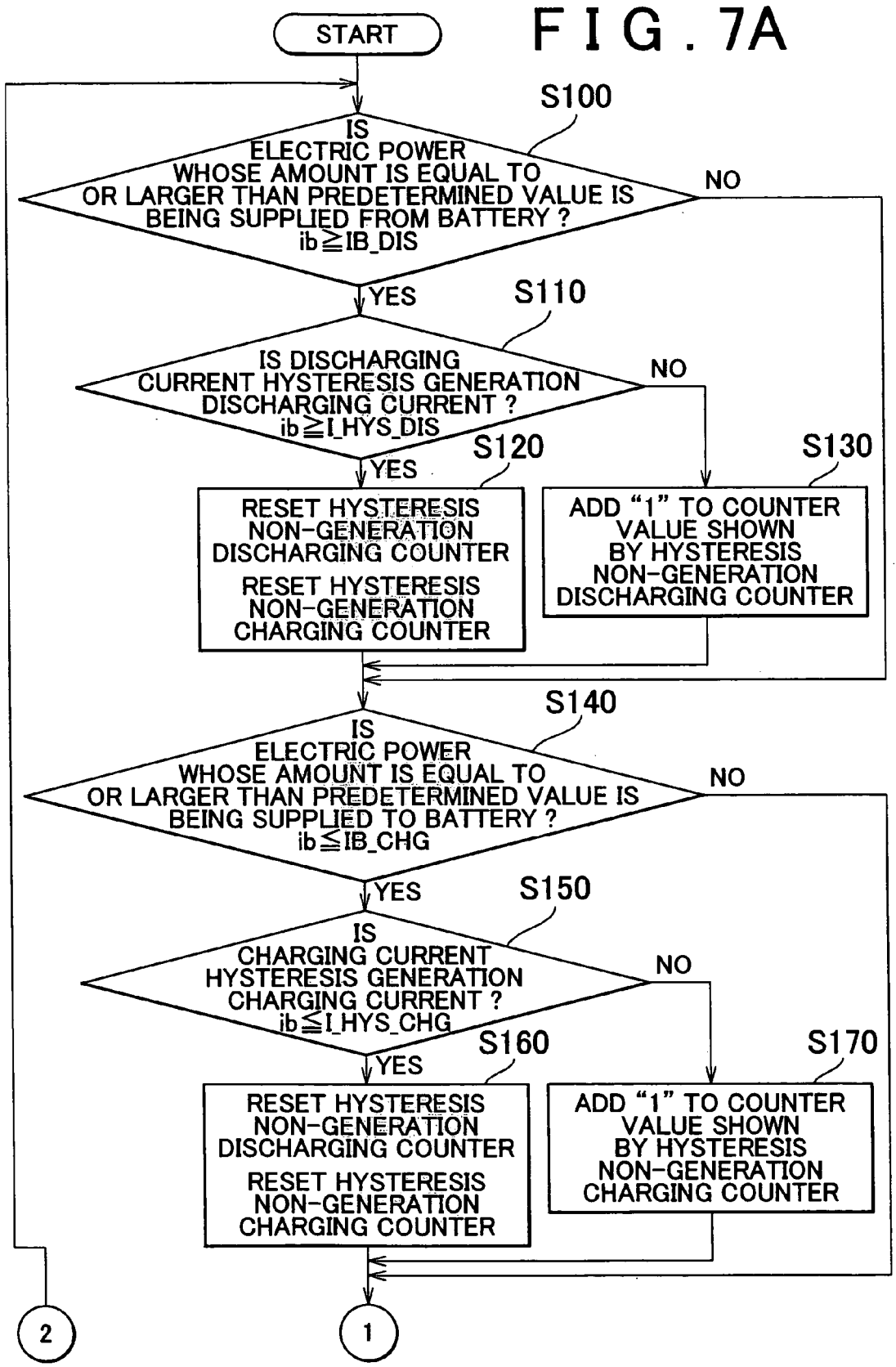

APPARATUS AND METHOD FOR CALCULATING OFFSET VALUE FOR AN ELECTRIC SENSOR

INCORPORATION BY REFERENCE

The disclosure of Japanese Patent Application No. 2002-362226 filed on Dec. 13, 2002 including the specification, drawings and abstract is incorporated herein by reference in its entirety.

BACKGROUND OF THE INVENTION

1. Field of the Invention

The invention relates to a technology for detecting current in a battery mounted on an electric vehicle or the like. More particularly, the invention relates to a technology for detecting charging/discharging current of a battery, which is used, for example, for calculating the remaining capacity of the battery.

2. Description of the Related Art

The remaining capacity of a secondary battery mounted on an electric vehicle or the like needs to be detected with high accuracy. For example, the remaining capacity is detected by accumulating charging/discharging current of the secondary battery. Therefore, in order to detect the remaining capacity of the secondary battery with high accuracy, it is necessary to detect charging/discharging current of the secondary battery with high accuracy. When current sensor for detecting charging/discharging current of the secondary battery is provided with an offset value, a detection error is caused by the amount corresponding to the offset value, and detection errors are accumulated. As a result, a large error is caused in the remaining capacity.

The offset value for the current sensor mounted on the electric vehicle or the like fluctuates with time, which cannot be ignored. Due to the time fluctuation, an error, which cannot be ignored, is caused in the remaining capacity. As a result, there is a possibility that problems such as overcharging and overdischarging occur, and performance of the secondary battery deteriorates. As such a current sensor, a semiconducting magnetometric sensor capable of detecting current with high accuracy is generally used. An external magnetic field such as the earth magnetism, magnetic flux leaking from a motor, a relay, a transformer, or coil near the sensor acts on the semiconducting magnetometric sensor provided near a conductor subject to detection. The offset value is generated due to the magnetic flux which acts on the semiconducting magnetometric sensor. The offset value fluctuates slightly due to movement of the vehicle. When charging/discharging current of the secondary battery are accumulated in order to detect the remaining capacity of the secondary battery, although the charging current and the discharging current cancel each other, the offset values are accumulated with time. Accordingly, the offset value gradually increases, and a large error is caused in the remaining capacity.

Assuming the offset value is constant and does not fluctuate, it is necessary only to measure and store the offset value, and to subtract the offset value from the measured value of the charging/discharging current. With the electric vehicle, however, a magnetism source inside the vehicle and a magnetic state outside the vehicle fluctuate spatially and with time, which causes fluctuation in the offset value with time. Therefore, it is impossible to completely cancel the offset value using the stored offset value. Since the electric vehicle itself moves, it is difficult to avoid fluctuation in the offset value due to a change in the environment surrounding the current sensor. In order to solve the above-mentioned problem, Japanese Patent Laid-Open Publication No. 11-150873 discloses a control device for an electric vehicle, which can detect the capacity of a secondary battery for an electric vehicle with high accuracy.

The control device for an electric vehicle disclosed in Japanese Patent Laid-Open Publication No. 11-150873 includes a running motor control circuit which is supplied with electric power from a secondary battery and in which an output from a running motor is controlled; a current detection circuit in which charging/discharging current of the secondary battery is detected; a remaining capacity calculation circuit in which the remaining capacity of the secondary battery is determined based on the detected discharging current; a secondary battery charging/discharging control circuit in which charging/discharging of the secondary battery is controlled based on the determined remaining capacity; a non-charging/discharging state detection circuit in which a predetermined non-charging/discharging state of the secondary battery is detected without using the current detection circuit; and an offset value detection storage circuit in which an output value of the current detection circuit is detected every time the non-charging/discharging state is detected and the detected output value is stored as an offset value for correcting charging/discharging current.

According to the control device, the predetermined non-charging/discharging state of the secondary battery is detected by a circuit other than the current detection circuit, and the offset value for a current sensor which detects discharging current of the secondary battery mounted on the electric vehicle is detected every time the predetermined non-charging/discharging state is detected. Accordingly, even when the offset value fluctuates with time due to spatial movement of the electric vehicle, a change of the current sensor with time, and the like. it is possible to detect charging current and discharging current of the secondary battery mounted on the electric vehicle with high accuracy. Therefore, it is possible to solve problems that the remaining capacity of the secondary battery is inaccurately estimated by accumulating errors in the offset value, which results in occurrence of overcharging or overdischarging of the secondary battery, or hindrance to effective use of the secondary battery.

However, in the control device disclosed in Japanese Patent Laid-Open Publication No. 11-150873, the error in the offset value, which is caused due to a hysteresis characteristic of a core, is not taken into consideration. The hysteresis characteristic differs from core to core used in the current sensor. When the offset value is calculated without taking the hysteresis characteristic into consideration, the value includes an error due to the hysteresis characteristic. Accordingly, an accurate offset value cannot be calculated.

SUMMARY OF THE INVENTION

The invention is made in order to solve the above-mentioned problems. It is an object of the invention to provide an apparatus and method for calculating an offset value for an electric sensor, which can detect the current value with high accuracy by accurately calculating an offset value due to a hysteresis characteristic of a core under no load in a current sensor of a magnetic flux detection type.

An apparatus for calculating an offset value for a current sensor, according to a first aspect of the invention, calculates an offset value for a current sensor of a magnetic flux detection type. The calculating apparatus includes a determining device which determines whether calculation of the offset value is permitted based on the current value detected by the current sensor; and a calculating device which calculates the current value detected by the current sensor as the offset value when calculation of the offset value is permitted by the determining device. The determining device makes a determination such that calculation of the offset value is permitted when the current value detected by the current sensor is switched from a positive value to a negative value, or from a negative value to a positive value.

According to the first aspect, in the current sensor of a magnetic flux detection type, a wire through which current subject to measurement flows is provided so as to penetrate the center of a core that is a small donut shaped magnetic material formed by mixing iron oxide or ferrite particles with an adhesive agent. The current sensor outputs the voltage value corresponding to the value of the current flowing through the wire, based on the magnetic flux generated in the core according to the value of the current flowing through the wire. As a characteristic of this core, a hysteresis characteristic is generated in the relationship between the current subject to measurement and the output voltage. The smaller the absolute value of the current value subject to measurement is, the smaller amount of the hysteresis characteristic is generated. Accordingly, when the current sensor is used for detecting charging/discharging current of the secondary battery, and also charging/discharging of the secondary battery is repeatedly performed, the smaller the absolute value of the charging/discharging current value subject to measurement is, the smaller the hysteresis area becomes. When the offset value is calculated, unless the effect of the hysteresis characteristic is eliminated as much as possible, the calculated offset value includes an error. Therefore, the determining device permits calculation of the offset value under no load when the current value detected by the current sensor is switched from a negative value to a positive value, or from a positive value to a negative value (i.e., when the battery state is switched from the charging state to the discharging state, or from the discharging state to the charging state), that is, when it is determined that the absolute value of the current value is small. The offset value thus calculated has high accuracy since the effect of the hysteresis characteristic is small. By taking the calculated offset value into consideration, it is possible to calculate a value close to the true current value based on the value actually measured by the current sensor. As a result, it is possible to detect the current value with high accuracy by accurately calculating the offset value due to the hysteresis characteristic of the core under no load.

In the first aspect, a configuration may be employed in which the determining device makes a determination such that calculation of the offset value is permitted when the current value detected by the current sensor is switched from a negative value to a positive value or from a positive value to a negative value, and also the absolute value of the current value is within a predetermined range.

According to the configuration, since there is only small effect of the hysteresis characteristic on the calculated offset value, it is possible to accurately calculate the offset value due to the hysteresis characteristic of the core under no load. As a result, it is possible to detect the current value with high accuracy.

In the first aspect, a configuration may be employed in which the determining device makes a determination such that calculation of the offset value is permitted when the current value detected by the current sensor is switched from a negative value to a positive value or from a positive value to a negative value, and also the state where the absolute value of the current value is within the predetermined range is continued for a predetermined time.

According to the configuration, since there is only small effect of the hysteresis characteristic on the calculated offset value, it is possible to accurately calculate the offset value due to the hysteresis characteristic of the core under no load. As a result, it is possible to detect the current value with high accuracy.

One of the predetermined range and the predetermined time may be changed according to the change in the temperature.

Since the hysteresis characteristic changes according to the temperature of the core, by changing the predetermined range and the predetermined time based on the temperature of the core, the temperature of the current sensor, the temperature of the secondary battery and the like, it is possible to calculate the offset value under no load with higher accuracy. As a result, it is possible to detect the current value with high accuracy.

In the first aspect, a determining device for determining whether the current sensor is not being supplied with electric power may be further provided. When it is determined that the electric sensor is not being supplied with electric power by the determining device, and also calculation of the offset value is permitted by the determining device, the calculating device calculates the current value detected by the current sensor as the offset value.

By calculating the current value detected by the current sensor as the offset value when the current sensor is not being supplied with electric power, it is possible to calculate a value close to the true current value based on the value actually measure by the current sensor by taking the offset value into consideration when the current sensor is being supplied with electric power and the load is actually connected. It may be determined that the current sensor is not being supplied with electric power when an ignition of the vehicle is turned OFF.

In a method for calculating an offset value for a current sensor, according to a second embodiment of the invention, an offset value for a current sensor of a magnetic flux detection type is calculated. The calculation method includes a determination step in which it is determined whether calculation of the offset value is permitted based on the current value detected by the current sensor; and a calculation step in which the current value detected by the current sensor is calculated as the offset value when calculation of the offset value is permitted in the determination step. In the determination step, it is determined that calculation of the offset value is permitted when the current value detected by the current sensor is switched from a negative value to a positive value, or from a positive value to a negative value.

According to the second aspect, when the offset value is calculated, unless the effect of the hysteresis characteristic, which is generated in a core provided in the current sensor, is eliminated as much as possible, the calculated offset value includes an error. Therefore, in the determination step, calculation of the offset value under no load is permitted when the current value detected by the current sensor is switched from a negative value to a positive value, or from a positive value to a negative value, that is, it is determined that the absolute value of the current value is small. Since there is only small effect of the hysteresis characteristic on the offset value calculated in the above-mentioned manner, the accuracy is high. By taking the calculated offset value into consideration, it is possible to calculate a value close to the true current value based on the value actually measured by the current sensor. As a result, by accurately calculating the offset value due to the hysteresis characteristic of the core under no load, it is possible to detect the current value with high accuracy.

Further, in the second aspect, in the determination step, determination may be made such that calculation of the offset value is permitted when the current value detected by the current sensor is switched from a negative value to a positive value or from a positive value to a negative value, and also the absolute value of the current value is within the predetermined range.

Since there is only small effect of the hysteresis characteristic on the offset value calculated in the above-mentioned manner, the accuracy is high. As a result, by accurately calculating the offset value due to the hysteresis characteristic of the core under no load, it is possible to detect the current value with high accuracy.

Further, in the second aspect, in the determination step, determination may be made such that calculation of the offset value is permitted when the current value detected by the current sensor is switched from a negative value to a positive value or from a positive value to a negative value, and also the state where the absolute value of the current value is within the predetermined range is continued for the predetermined time.

Since there is only small effect of the hysteresis characteristic on the offset value calculated in the above-mentioned manner, the accuracy is high. As a result, by accurately calculating the offset value due to the hysteresis characteristic of the core under no load, it is possible to detect the current value with high accuracy.

In this case, either one of the predetermined range and the predetermined time may be changed according to the temperature.

Since the hysteresis characteristic changes according to the temperature of the core, by changing the predetermined range and the predetermined time based on the temperature of the core, the temperature of the current sensor, the temperature of the secondary battery and the like, it is possible to calculate the offset value under no load with higher accuracy. As a result, it is possible to detect the current value with high accuracy.

Also, in the second aspect, a determination step in which it is determined whether the current sensor is not being supplied with electric power may be further provided. When it is determined that the current sensor is not being supplied with electric power in the determination step, and also calculation of the offset value is permitted in the determination step, the current value detected by the current sensor is calculated as the offset value in the calculation step.

By calculating the current value detected by the current sensor as the offset value when the current sensor is not being supplied with electric power, it is possible to calculate a value close to the true current value based on the value actually measure by the current sensor, by taking the offset value into consideration when the current sensor is being supplied with electric power and the load is actually connected. It may be determined that the current sensor is not being supplied with electric power when an ignition of the vehicle is turned OFF.

BRIEF DESCRIPTION OF THE DRAWINGS

The foregoing and further objects, features and advantages of the invention will become apparent from the following description of preferred embodiments with reference to the accompanying drawings, wherein like numerals are used to represent like elements and wherein:

FIG. 7A and FIG. 7B are a flowchart showing the control structure for the program performed by the battery ECU according to the embodiment of the invention.

DETAILED DESCRIPTION OF THE PREFERRED EMBODIMENTS

Figure 1:
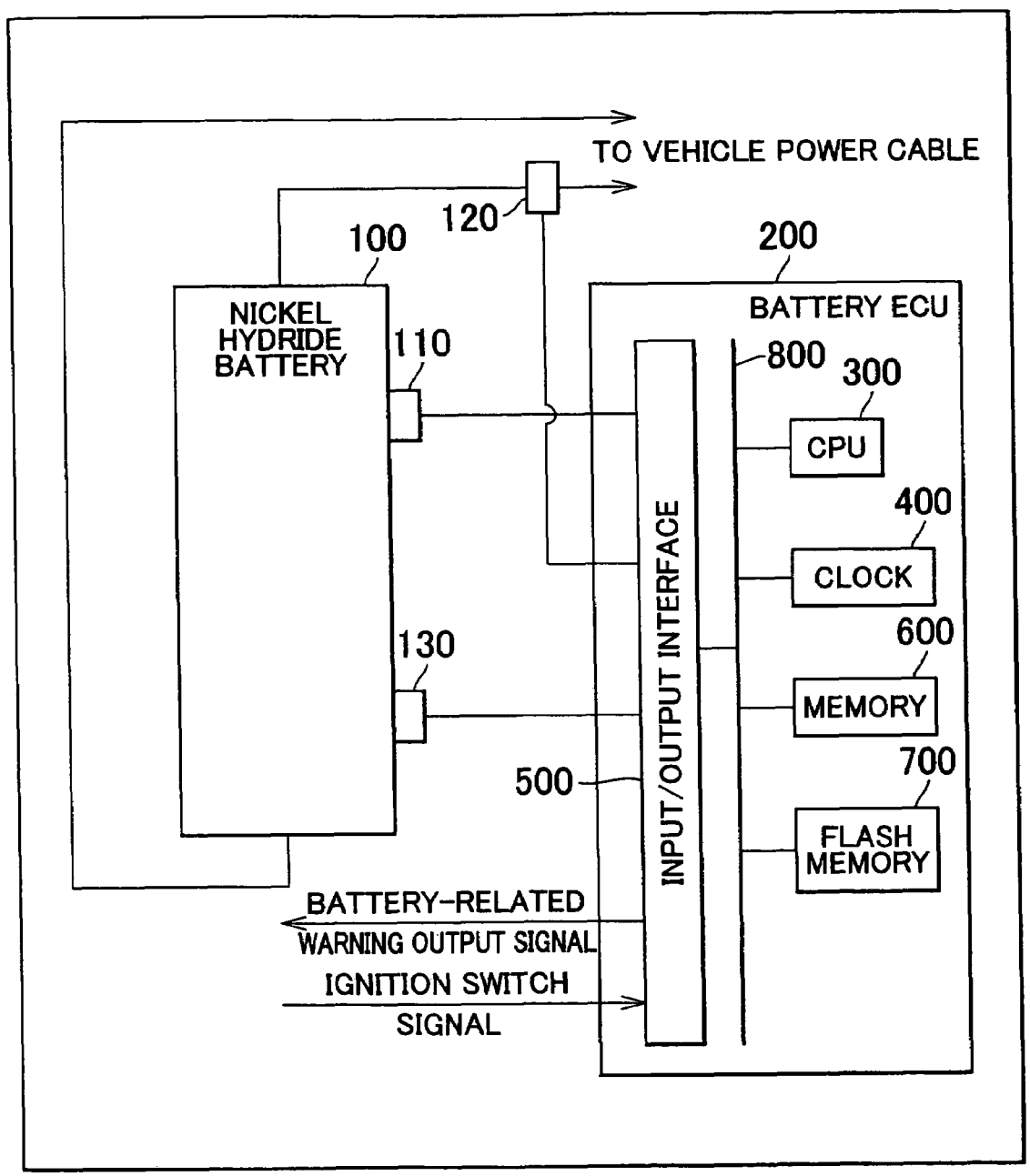
FIG. 1 is a control block diagram for a vehicle on which a battery ECU according to an embodiment of the invention is mounted.

Hereafter, embodiments according to the invention will be described with reference to accompanying drawings. The same reference numerals are assigned to same components. The names and the functions of the components having the same reference numerals are also the same. Therefore, detailed description concerning the components having the same reference numerals will be made only one time, and will not be repeated.

A description will be made concerning a calculating apparatus which is applied to a secondary battery, such as a nickel hydride battery, for supplying electric power to electrical components mounted on a vehicle, and which calculates the offset value of an ammeter for detecting charging current to the nickel hydride battery and discharging current from the nickel hydride battery. The battery to which the calculating apparatus according to the invention is applied is not limited to the nickel hydride battery. The calculating apparatus can be applied to various types of batteries such as a lead storage battery, a NiCd battery and a lithium ion battery.

A description is made concerning a power unit for a vehicle including a battery ECU (electronic control unit) 200 which realizes the calculating apparatus according to the embodiment of the invention. As shown in FIG. 1, the power unit for a vehicle includes a nickel hydride battery 100 and the battery ECU 200. A thermistor 110 for measuring the temperature of the nickel hydride battery 100, and a voltmeter 130 for measuring the voltage in the nickel hydride battery 100 are attached to the nickel hydride battery 100. An ammeter 120 for measuring charging/discharging current is attached to an input/output cable which connects the nickel hydride battery 100 to a power cable of the vehicle. The battery ECU 200 includes an input/output interface 500 which is connected to an input signal wire extending from the thermistor 110, an input signal wire extending from the ammeter 120, an input signal wire extending from the voltmeter 130, a battery-related warning output signal wire and an ignition switch ON signal wire; a CPU (central processing unit) 300 which controls the battery ECU 200; a clock 400; memory 600 which stores various data and flush memory 700.

A power supply terminal of the nickel hydride battery 100 is connected to a vehicle buffer cable, and electric power is supplied to a running motor, auxiliary electronic components and the like in the vehicle. The temperature signal detected by the thermistor 110 which measures the temperature of the nickel hydride battery 100 is transmitted to the CPU 300 through the input/output interface 500 of the battery ECU 200. The current value detected by the ammeter 120 which measures the charging current to the nickel hydride battery 100 and the discharging current from the nickel hydride battery 100 is transmitted to the CPU 300 through the input/output interface 500 of the battery ECU 200. The ammeter 120 is a current sensor of a magnetic flux detection type, and the CPU 300 detects the accurate charging/discharging current value in consideration of the offset value calculated by the after-mentioned method. By accumulating the accurate charging/discharging current values thus detected, it is possible to accurately calculate the remaining capacity or the like of the nickel hydride battery 100. When the remaining capacity or the like of the nickel hydride battery 100 shows an abnormal value, the battery ECU switches the battery related abnormality output signal from "OFF" to "ON".

The voltage value detected by the voltmeter 130 which measures the voltage in the nickel hydride battery 100 is transmitted to the CPU300 through the input/output interface 500 of the battery ECU 200.

Inside the battery ECU 200, the input/output interface 500, the CPU 300, the clock 400, the memory 600 and the flash memory 700 are connected with each other through an internal bus 800, and can perform data communication each other.

Figure 2:
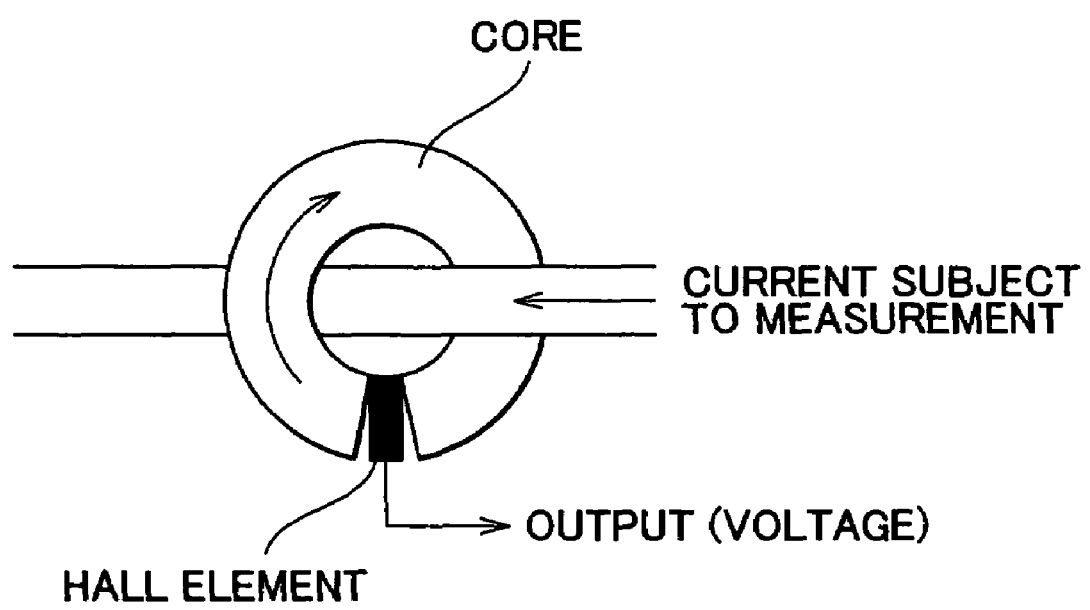
FIG. 2 is a view showing the configuration of an ammeter.

The configuration of the ammeter 120 shown in FIG. 1 will be described with reference to FIG. 2. As shown in FIG. 2, the ammeter 120 measures the value of the current which flows from the nickel hydride battery 100 to the vehicle power cable through the input/output cable. The ammeter 120 is a current sensor of a magnetic flux detection type, and has a core which is a small donut shaped magnetic material formed by mixing iron oxide or ferrite particles with an adhesive agent. A cable through which current subject to measurement flows is provided so as to penetrate through the center of the core. A hall element outputs a voltage based on the magnetic flux generated in the core according to the value of the charging/discharging current flowing through the cable. The core has a hysteresis characteristic generated in the relationship between the current subject to measurement and the detected current.

Figure 3:
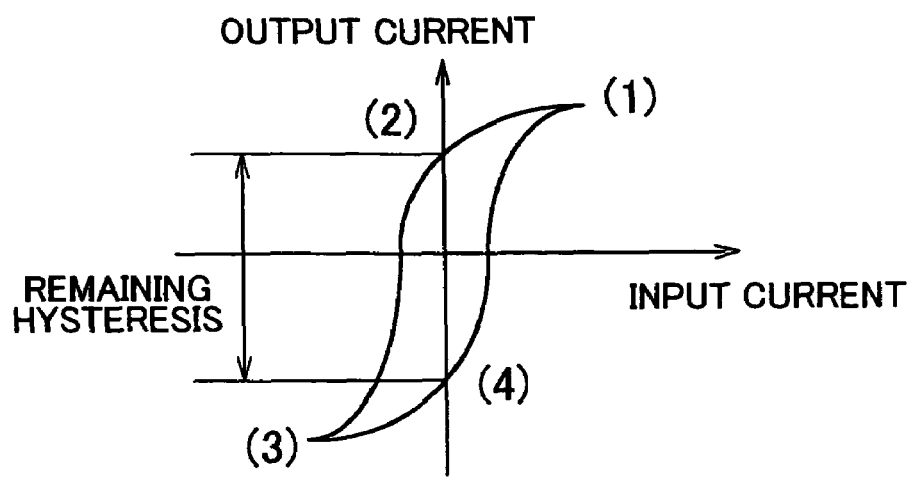
FIG. 3 is a view (1) showing the hysteresis characteristic of a core.

The hysteresis characteristic will be described with reference to FIG. 3. In FIG. 3, the horizontal axis shows the input current, and the vertical axis shows the output current. The input current is the current subject to measurement, and the output current is the value obtained by converting the output voltage detected by the hall element into the output current. When there is no hysteresis characteristic, the relationship between the input current and the output current is the direct proportion with an inclination of "1". However, as shown in FIG. 3, since there is the hysteresis characteristic, the relationship between the input current and the output current is not direct proportion with an inclination of "1".

The input current and the output current are positive values when electric power is supplied from the nickel hydride battery 100, and are negative values when electric power is supplied to the nickel hydride battery 100. The configuration may be employed where the input current and the output current are negative values when electric power is supplied from the nickel hydride battery 100, and are positive values when electric power is supplied to the nickel hydride battery 100.

As shown in FIG. 3, the state of the hysteresis when the state of the battery is switched from the charging state to the discharging state changes as follows; state (1)→state (2)→state (3)→state (4). Namely, when the state is switched from the charging state (1) to the discharging state (3), and then is switched to the no load state (input is "0"), the effect of the remaining hysteresis is generated, as in the state (2) or state (4). The effect of the remaining hysteresis causes an error in the offset value. The remaining hysteresis fluctuates according to the latest current supply history. Also, the hysteresis characteristic varies from core to core.

Figure 4:
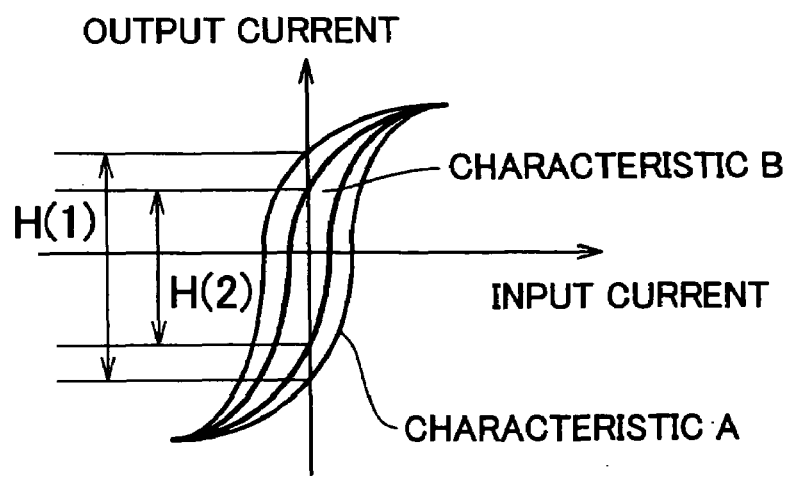
FIG. 4 is a view (2) showing the hysteresis characteristic of another core.

As shown in FIG. 4, when there are two cores having different hysteresis characteristics, for example, the characteristic A and the characteristic B, the remaining hysteresis H(1) is larger than the remaining hysteresis H(2). The hysteresis characteristic of the core having the characteristic A is unfavorable compared with that of the core having the characteristic B. Namely, when charging/discharging is repeated in the same manner, the core which has larger remaining hysteresis has more unfavorable hysteresis characteristic.

Figures 5, 6:
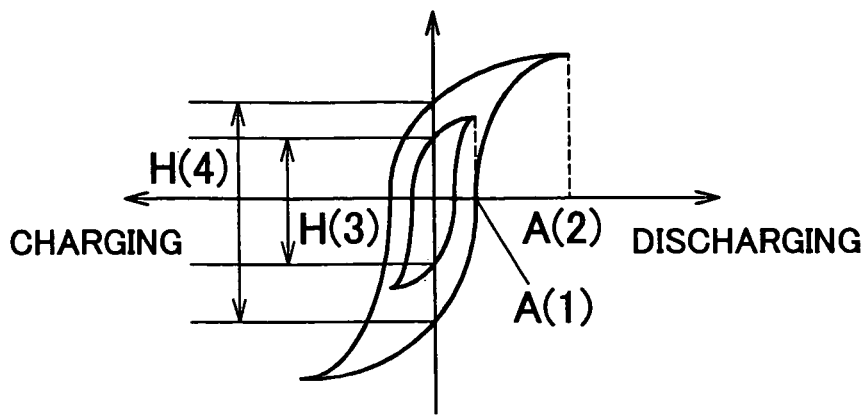
FIG. 5 is a view (3) showing the hysteresis characteristic of another core.
FIG. 6 is a table which is stored in memory and which shows changes in constants according to the change in the temperature.

Also, as shown in FIG. 5, when the charging/discharging current widths are different between the cores having the same characteristic, the hysteresis characteristics of the cores are generally in the similar figures. Therefore, when charging/discharging is repeated in the region where the charging/discharging current value is small, the hysteresis A (1) shows a small loop. When relatively large volume of charging/discharging is repeated, the remaining hysteresis is small with respect to A (2). Namely, as shown in FIG. 5, when charging/discharging is repeated in the region where the charging/discharging current value is small, the remaining hysteresis is H(3). On the other hand, when charging/discharging is repeated in the region where the charging/discharging current value is relatively large, the remaining hysteresis is H(4).

Thus, in the case where the offset value, which cannot be ignored when the ammeter 120 including the current sensor of a magnetic flux detection type is used, is calculated, by minimizing the effect of the hysteresis characteristic, it is possible to measure the accurate offset value.

FIG. 6 shows a table which is stored in the memory 600 of the battery ECU 200 and which shows changes in constants according to the change in the temperature. The constants are used in the after-mentioned offset value calculating program. The temperature shown in FIG. 6 is the temperature of the ammeter 120 (core) body. The hall element has the temperature drift characteristic. In order to take the effect of the temperature drift characteristic into consideration, such a table is used. The ambient temperature may be used instead of the temperature of the core body. For example, the temperature of the nickel hydride battery 100, which is detected by the therminstor 110 provided in the nickel hydride battery 100, may be used. As shown in FIG. 6, constants T_DIS, T_CHG, I_HYS_DIS and I_HYS_CHG are set for each temperature. The values of the constants are set in consideration of the characteristic of the core, charging/discharging control in the vehicle (current frequency distribution), and the like.

Figure 7B:
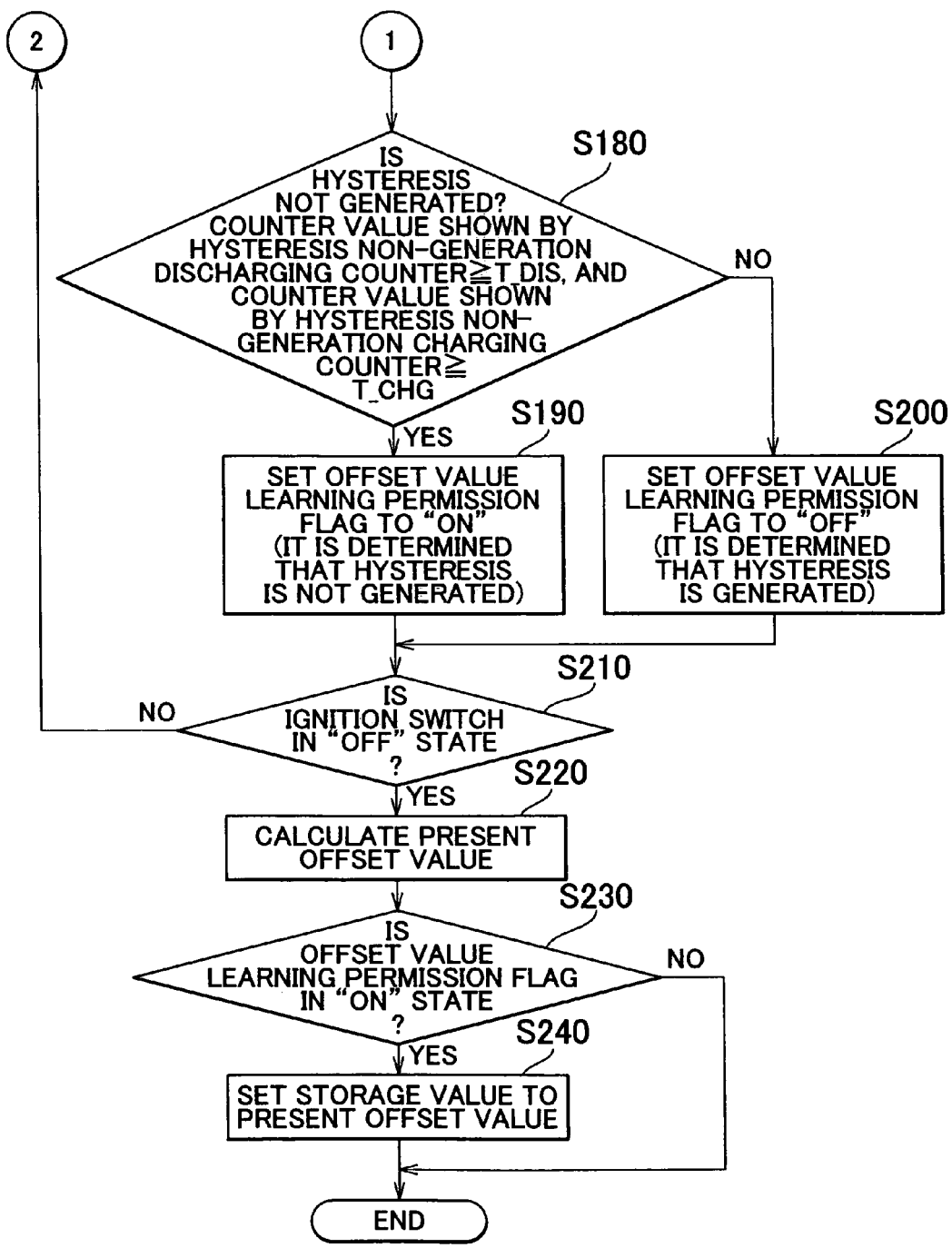

The control structure of the offset value calculating program, which is performed by the battery ECU 200 that is the control device according to the embodiment, will be described with reference to FIG. 7A and FIG. 7B. Hereafter, the discharging current is a positive value, and the charging current is a negative value in the description.

In step (hereinafter, simply referred to as "S") 100, the battery ECU 200 determines whether electric power whose amount is equal to or larger than a predetermined value is being supplied from the battery. The determination is made depending on whether the current value ib detected by the ammeter 120 is equal to or larger than the predetermined value IB_DIS. When it is determined that the current value ib detected by the ammeter 120 is equal to or larger than the predetermined value IB_DIS ("YES" in S100), the process proceeds to S110. When a negative determination is made in S100 ("NO" in S100), the process proceeds to S140.

The battery ECU 200 determines whether the discharging current is the hysteresis generation discharging current in S110. The determination is made whether the current value ib detected by the ammeter 120 is equal to or larger than a threshold value I_HIS_DIS shown in FIG. 6. When it is determined that the current value detected by the ammeter 120 is the hysteresis generation discharging current ("YES" in S110), the process proceeds to S120. When a negative determination is made in S110 ("NO" in S110), the process proceeds to S130.

The battery ECU 200 resets the hysteresis non-generation discharging counter, and resets the hysteresis non-generation charging counter in S120. Both the hysteresis non-generation discharging counter and the hysteresis non-generation charging counter are provided in the battery ECU 200. The ECU 200 adds "1" to the counter value shown by the hysteresis non-generation discharging counter in S130.

The battery ECU 200 determines whether electric power whose amount is equal to or larger than the predetermined value is being supplied to the battey in S140. The determination is made whether the current value ib detected by the ammeter 120 is equal to or smaller than the predetermined value IB_CHG. When it is determined that the current value ib detected by the ammeter 120 is equal to or smaller than the predetermined value IB_CHG ("YES" in S140), the process proceeds to S150. When a negative determination is made ("NO" in S140), the process proceeds to S180.

The battery ECU 200 determines whether the charging current is the hysteresis generation charging current in S150. The determination is made whether the current value ib detected by the ammeter 120 is equal to or smaller than the threshold value I_HIS_CHG shown in FIG. 6. When it is determined that the current value detected by the ammeter 120 is the hysteresis generation charging current ("YES" in S150), the process proceeds to S160. When a negative determination is made ("NO" in S150), the process proceeds to S170.

The battery ECU 200 resets the hysteresis non-generation discharging counter, and resets the hysteresis non-generation charging counter in S160. The ECU 200 adds "1" to the counter value shown by the hysteresis non-generation charging counter in S170.

The battery ECU 200 determines whether the hysteresis is not generated in S180. The determination is made whether the counter value shown by the hysteresis non-generation discharging counter is equal to or larger than the threshold value T_DIS shown in FIG. 6, and also the counter value shown by the hysteresis non-generation charging counter is equal to or larger than the threshold value T_CHG shown in FIG. 6. When it is determined that the counter value shown by the hysteresis non-generation discharging counter is equal to or larger than the threshold value T_DIS, and also the counter value shown by the hysteresis non-generation charging counter is equal to or larger than the threshold value T_CHG ("YES" in S180), the process proceeds to S190. When a negative determination is made ("NO" in S180), the process proceeds to S200.

The battery ECU 200 sets the offset value learning permission flag to "ON" in S190. Namely, it is determined that the hysteresis is not generated. Therefore, the flag for permitting leaning of the offset value is set to "ON".

The battery ECU 200 sets the offset value learning permission flag to "OFF" in S200. Namely, it is determined that the hysteresis is generated. Therefore, the offset value learning permission flag is not set to "ON", and calculation of the offset value is not permitted. The state of the offset value learning permission flag is stored in the memory 600.

The battery ECU 200 determines whether the ignition switch is in the "OFF" state in S210. The determination is made according to the ignition switch signal which is input in the battery ECU 200. When it is determined that the ignition switch is in the "OFF" state ("YES" in S210), the process proceeds to S220. When a negative determination is made ("NO" in S210), the process returns to S100.

The battery ECU 200 calculates the current value detected by the ammeter 120 as the present offset value in S220.

The battery ECU 200 determines whether the offset value learning permission flag is in the "ON" state in S230. When it is determined that the offset value learning permission flag is in the "ON" state ("YES" in S230), the process proceeds to S240. When a negative determination is made ("NO" in S230), the process ends.

The battery ECU 200 sets the storage value to the present offset value calculated in S220 and stores it in the memory 600 in S240.

Based on the above-mentioned configuration and the flowchart, the operation in the battery ECU 200 according to the embodiment will be described.

When it is determined that the nickel hydride battery 100 is in the discharging state while the vehicle is running, and the current value ib during discharging, which is detected by the ammeter 120, is equal to or larger than the predetermined value IB_DIS ("YES" in S100), and also the current value ib is smaller than the threshold value I_HYS_DIS ("NO" in S110), "1" is added to the counter value shown by the hysteresis non-generation discharging counter (S130). When the operation state of the vehicle is switched to the regenerative state, the state of the nickel hydride battery 100 is switched to the charging state. In this state, when the current value ib of the charging value detected by the ammeter 120 is equal to or smaller than the predetermined value IB_CHG ("YES" in S140), and the current value ib is larger than the threshold value I_HYS_CHG ("NO" in S150), "1" is added to the counter value shown by the hysteresis non-generation charging counter (S170).

In this state, when the current value ib becomes equal to or larger than the threshold value I_HYS_DIS during discharging ("YES" in S110), both the hysteresis non-generation discharging counter and the hysteresis non-generation charging counter are reset (S120). When the current value ib becomes equal to or smaller than the threshold value I_HYS_CHG during charging ("YES" in S150), both the hysteresis non-generation discharging counter and the hysteresis non-generatioin charging counter are reset (S160).

When it is determined that the hysteresis is not generated ("YES" in S180), the offset value learning permission flag is set to "ON" (S190). Namely, when the counter value shown by the hysteresis non-generation discharging counter is equal to or larger than the threshold value T_DIS and also the counter value shown by the hysteresis non-generation charging counter is equal to or larger than the threshold value T_CHG, the offset value learning permission flag is set to "ON".

When the vehicle is stopped and the ignition switch is turned "OFF" ("YES" in S210), the present value of the offset value is calculated (S220). At this time, the current value under no load state is measured by the ammeter 120, and is calculated as the present offset value. When the offset value learning permission flag is in the "ON" state ("YES" in S230), the record value is set to the present offset value as the offset value and is stored in the memory 600 (S240).

Figure 8:
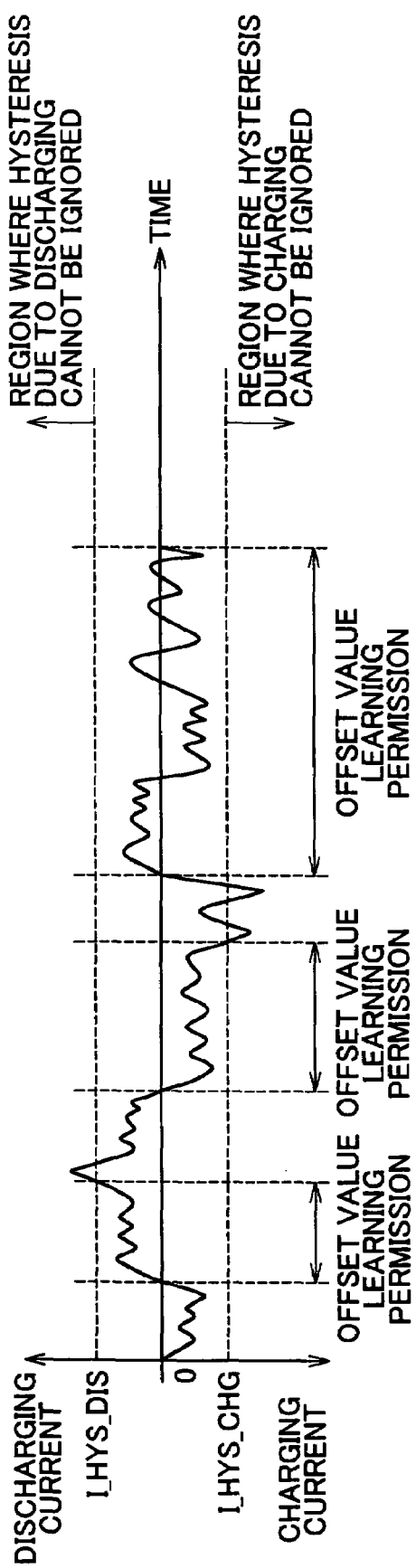
FIG. 8 is a timing chart showing the operation in the battery ECU according to the embodiment of the invention.

The operation will be described with reference to FIG. 8. In FIG. 8, the horizontal axis of the graph is the time base, the plus side in the vertical axis shows the discharging current value, and the minus side in the vertical axis shows the charging current value. As shown in FIG. 8, the offset value learning permission flag is set to "ON", when the current value is in the region where the hysteresis due to discharging can be ignored or in the region where the hysteresis due to charging can be ignore, and also the current value ib is changed from a negative value to a positive value, or from a positive value to a negative value. Namely, when the current value ib during discharging is smaller than the threshold value I_HYS_DIS ("NO" in S110), "1" is added to the counter value shown by hysteresis non-generation discharging counter. When the current value ib during charging is larger than the threshold value I_HYS_CHG ("NO" in S150), "1" is added to the counter value shown by the hysteresis non-generation charging counter. This process is repeatedly performed at intervals of sampling time of 100 ms. When the counter value shown by the hysteresis non-generation discharging counter becomes equal to or larger than the threshold value T_DIS and also the counter value shown by the hysteresis non-generation charging counter becomes equal to or larger than the threshold value T_CHG, while the process is repeatedly performed ("YES" in S180), the offset value learning permission flag is set to "ON". Namely, the hysteresis is not generated, and the offset value can be calculated. As shown in FIG. 8, this timing is shown as the offset value learning permission time. Namely, the fact that the state where the discharging current value ib (a positive value) is smaller than the threshold value I_HYS_DIS continues for the predetermined period, or the state where the charging current value ib (a negative value) is larger than the predetermined threshold value I_HYS_CHG continues for the predetermined time is used as the condition. When the discharging current value ib (a positive value) becomes equal to or larger than the threshold value I_HYS_DIS or the charging current value ib (a negative value) becomes equal to or smaller than the threshold value I_HYS_CHG during the period, the counter is reset.

Thus, the battery ECU according to the embodiment of the invention monitors the current value during discharging and charging, and counts up the counter when the hysteresis is not generated. When the counter value becomes equal to or larger than the predetermined threshold value in the charging state or the discharging state, the offset value learning permission flag is set to "ON". Only when the offset value learning permission flag is in the "ON" state, the current value when the ignition switch is turned OFF is calculated as the offset value and is stored in the memory. It is possible to calculate a value close to the true current value based on the value actually measured by the current sensor by taking the offset value into consideration. As a result, by accurately calculating the offset value due to the hysteresis characteristic of the core under no load, it is possible to detect the current with high accuracy.

Thus, the embodiment of the invention that has been disclosed in the specification is to be considered in all respects as illustrative and not restrictive. The technical scope of the invention is defined by claims, and all changes which come within the meaning and range of equivalency of the claims are therefore intended to be embraced therein.

What is claimed is:

1. An apparatus for calculating an offset value for a current sensor of a magnetic flux detection type, comprising:
a determining device which determines whether calculation of the offset value is permitted based on a current value detected by the current sensor, the determining device making the determination such that calculation of the offset value is permitted when the current value detected by the current sensor is switched from a negative value to a positive value, or from a positive value to a negative value and when an absolute value of the current value is within a predetermined range, wherein the predetermined range is based on the characteristics of a core of the current sensor; and
a calculating device which calculates the current value detected by the current sensor as the offset value when calculation of the offset value is permitted by the determining device.

2. The apparatus according to claim 1, wherein the predetermined range is changed according to a change in a temperature of the current sensor.

3. An apparatus for calculating an offset value for a current sensor of a magnetic flux detection type, comprising:
a determining device which determines whether calculation of the offset value is permitted based on a current value detected by the current sensor, the determining device making the determination such that calculation of the offset value is permitted when the current value detected by the current sensor is switched from a negative value to a positive value, or from a positive value to a negative value; and
a calculating device which calculates the current value detected by the current sensor as the offset value when calculation of the offset value is permitted by the determining device,
wherein the determining device makes a determination such that calculation of the offset value is permitted when the current value detected by the current sensor is switched from a negative value to a positive value, or from a positive value to a negative value, and when a state where an absolute value of the current value is within a predetermined range is continued for a predetermined time,
wherein one of the predetermined range and the predetermined time is changed according to a change in a temperature of the current sensor.

4. The apparatus according to claim 1, further comprising:
a determining device which determines whether the current sensor is not being supplied with electric power, wherein the calculating device calculates the current value detected by the current sensor as the offset value when it is determined that the electric sensor is not being supplied with electric power by the determining device, and also calculation of the offset value is permitted by the determining device.

5. The apparatus according to claim 4, wherein the current sensor and the apparatus for calculating an offset value for the current sensor are mounted on a vehicle, and the determining device determines that the current sensor is not being supplied with electric power when an ignition of the vehicle is turned OFF.

6. A method for correcting a current value detected by a current sensor of a magnetic flux detection type, comprising:
- determining whether calculation of an offset value is permitted, wherein calculation of the offset value is permitted when the current value detected by the current sensor is switched from a negative value to a positive value, or from a positive value to a negative value, and when an absolute value of the current value is within a predetermined range, wherein the predetermined range is based on the characteristics of a core of the current sensor;
- calculating the current value detected by the current sensor as the offset value when calculation of the offset value is permitted and;
- correcting the current value detected by the current sensor when detecting a charging or discharging current of a battery using the calculated offset value to account for a hysteresis characteristic of the core.

7. The method according to claim 6, wherein the predetermined range is changed according to a change in a temperature of the current sensor.

8. A method for correcting a current value detected by a current sensor of a magnetic flux detection type, comprising:
- determining whether calculation of an offset value is permitted, wherein calculation of the offset value is permitted when a current value detected by the current sensor is switched from a negative value to a positive value, or from a positive value to a negative value, and when a state where an absolute value of the current value is within a predetermined range is continued for a predetermined time;
- calculating the current value detected by the current sensor as the offset value when calculation of the offset value is permitted,
- wherein one of the predetermined range and the predetermined time is changed according to a change in a temperature of the current; and
- correcting the current value detected by the current sensor when detecting a charging or discharging current of a battery using the calculated offset value to account for a hysteresis characteristic of a core of the current sensor.

9. The method according to claim 6, further comprising:
- a determination step in which it is determined whether the current sensor is not being supplied with electric power, wherein, in the calculation step, the current value detected by the current sensor is calculated as the offset value, when it is determined that the current sensor is not being supplied with electric power in the determination step, and also calculation of the offset value is permitted.

10. The method according to claim 9, wherein the current sensor is mounted on a vehicle, and, in the determination step, it is determined that the current sensor is not being supplied with electric power when an ignition of the vehicle is turned OFF.

* * * * *